(12) United States Patent
Atesal et al.

(10) Patent No.: US 9,548,722 B2
(45) Date of Patent: Jan. 17, 2017

(54) APPARATUS AND METHODS FOR REDUCING GLITCHES IN DIGITAL STEP ATTENUATORS

(71) Applicant: Analog Devices Global, Hamilton (BM)

(72) Inventors: Yusuf Alperen Atesal, Istanbul (TR); Peter J. Katzin, Arlington, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/719,241

(22) Filed: May 21, 2015

(65) Prior Publication Data
US 2016/0118959 A1    Apr. 28, 2016

Related U.S. Application Data

(60) Provisional application No. 62/067,301, filed on Oct. 22, 2014.

(51) Int. Cl.
*H03H 11/24* (2006.01)
*H03H 7/25* (2006.01)

(52) U.S. Cl.
CPC .............. *H03H 11/245* (2013.01); *H03H 7/25* (2013.01)

(58) Field of Classification Search
CPC .................................. H03H 11/245; H03H 7/25
USPC ........................................................ 333/81 R
See application file for complete search history.

(56) References Cited

U.S. PATENT DOCUMENTS

| | | | |
|---|---|---|---|
| 5,355,036 A | 10/1994 | Gata | |
| 5,541,600 A | 7/1996 | Blumenkrantz et al. | |
| 5,798,959 A | 8/1998 | Onetti et al. | |
| 2010/0066427 A1 | 3/2010 | George | |
| 2014/0002214 A1* | 1/2014 | Bawell ...................... | H01P 1/22 333/81 R |
| 2015/0244051 A1* | 8/2015 | Domino ................... | H03H 7/25 375/219 |

FOREIGN PATENT DOCUMENTS

| | | |
|---|---|---|
| GB | 2 415 844 | 1/2006 |
| JP | H05 95239 | 4/1993 |

OTHER PUBLICATIONS

Extended European Search Report mailed Mar. 21, 2016 in Application No. 15189983.8-1805 (11 pages).

* cited by examiner

*Primary Examiner* — Stephen E Jones
*Assistant Examiner* — Scott S Outten
(74) *Attorney, Agent, or Firm* — Knobbe, Martens, Olson & Bear, LLP

(57) ABSTRACT

Apparatus and methods for reducing glitches in digital step attenuators are disclosed. By configuring a multi-bit DSA such that an attenuation control block changes a plurality of control signals in a manner sequencing individual switches of the DSA, glitches can be reduced and RF signal behavior can be enhanced. The sequence, based upon a unit time delay, causes the transient attenuation value to be bounded between a minimum and maximum and can improve settling time.

20 Claims, 8 Drawing Sheets

| Switch Control | Delay Amount |
|---|---|
| C12 | 5 τ |
| C12_i | 10 τ |
| C12_x | 1 τ |
| C8 | 5 τ |
| C8_i | 10 τ |
| C8_x | 1 τ |
| C4 | 5 τ |
| C4_i | 10 τ |
| C4_x | 1 τ |
| C2 | 14 τ |
| C2_i | 4 τ |
| C1 | 12 τ |
| C1_i | 4 τ |
| C0 | 12 τ |
| C0_i | 4 τ |

FIG. 7A

| Switch Control | Delay Amount |
|---|---|
| C12 | 9 τ |
| C12_i | 1 τ |
| C12_x | 14 τ |
| C8 | 9 τ |
| C8_i | 1 τ |
| C8_x | 14 τ |
| C4 | 9 τ |
| C4_i | 1 τ |
| C4_x | 14 τ |
| C2 | 7 τ |
| C2_i | 14 τ |
| C1 | 7 τ |
| C1_i | 13 τ |
| C0 | 7 τ |
| C0_i | 12 τ |

FIG. 7B

APPARATUS AND METHODS FOR REDUCING GLITCHES IN DIGITAL STEP ATTENUATORS

The present application claims priority to U.S. Provisional Patent Application No. 62/067,301, filed Oct. 22, 2014, titled "APPARATUS AND METHODS FOR REDUCING GLITCHES IN DIGITAL STEP ATTENUATORS," the entirety of which is hereby incorporated herein by reference.

BACKGROUND

Field

Embodiments of the invention relate to electronic systems, and more particularly, to digital step attenuators.

Description of the Related Technology

Digital step attenuators (DSA) frequently include attenuator units and switches to selectively adjust the attenuation level. A control unit can provide control signals to control the state of the switches, on state or off state, which in turn control the state of the attenuator units, insertion state or attenuation state.

In one example, a control unit provides control signals to change the state of switches of a DSA to increase the impedance and thereby increase the total attenuation.

In another example, a control unit provides control signals to change the state of switches of a DSA to decrease the impedance and thereby decrease the total attenuation.

SUMMARY

In one embodiment an attenuator component includes a plurality of attenuator units that have an input and an output and are connected together. The plurality of attenuator units each have an attenuation state, wherein an input signal is attenuated between the input and the output by a unit attenuation value, and an insertion state, wherein the input signal is provided to the output without being attenuated by the attenuation value. The plurality of attenuator units are connected so that the attenuator component defines a range of attenuation values determined by the sum of the plurality of unit attenuation values.

The attenuator component further includes a control unit that provides control signals to the plurality of attenuation units so as to provide a selected attenuation level of the attenuation component for a particular input signal. The control signal has, for at least some changes of the attenuation levels, a predetermined sequence of changing attenuation units between the insertion state and the attenuation state, so that the transient glitches of the attenuator component is maintained within a pre-selected range when the attenuation level is transitioning between a first level and a second level. The control unit provides the control signals to the plurality of attenuation units to achieve selected attenuation level for the attenuation component according to the sequence when transitioning between the first level and the second level.

According to some embodiments, the sequence of attenuation values comprise a timing sequence by which the individual attenuation units are switched between the first and second attenuation levels at time intervals that maintains the overshoot and the undershoot of the selected attenuation level within a pre-defined range. The control unit can have a plurality of stored timing sequences for a plurality of changes from one selected attenuation level to another to control the timing of the change of individual attenuation units. The control unit can include a plurality of look up tables that have the timing sequences.

In another embodiment the attenuator units include a first series switch with an associated resistance and a shunt switch wherein the first series switch is closed to provide the attenuation state and the shunt switch is closed to provide the insertion state. At least some of the attenuator units include a second series switch and associated resistor that is configured during transitioning between the first and second attenuation level so as to maintain the transient glitches occurring during the transition of the attenuation state of the at least some of the attenuation units are reduced by the resistor associated with the second series switch.

According to one embodiment the plurality of attenuator units each comprise an attenuation network selected from the group consisting of T-type networks, hybrid-T networks, and pi-type networks.

In another embodiment the attenuator units include switchable components that receive control signals from the control unit that switch the unit between the attenuation state and the insertion state. The timing sequence can include a unit time value T and can comprise a table of delays for each of the switchable components in the attenuators, wherein the table of delays determine the timing of the delivery of the control signals as a function of the unit time value T.

In one embodiment an attenuator component includes a plurality of attenuator units that have an input and an output and are connected together. The plurality of attenuator units can each have an attenuation state wherein an input signal is attenuated between the input and the output by a unit attenuation value and an insertion state wherein the input signal is provided to the output without being attenuated by the attenuation value. The plurality of attenuator units can be connected so that the attenuator component defines a range of attenuation values determined by the sum of the plurality of unit attenuation values, and at least some of the attenuator units can include an intermediate switching component.

The attenuator component further includes a control unit that provides control signals to the plurality of attenuation units so as to provide a selected attenuation level of the attenuation component for a particular input signal. The control signals can have, for at least some of the attenuation levels, an intermediate control signal that implements the intermediate switching component during transition of the attenuator unit between the attenuation state and the insertion state such that transient glitch of the attenuator unit during the transition is maintained within a preselected range. In another embodiment the control unit provides control signals to the plurality of attenuation units so as to provide a selected attenuation level of the attenuation component for a particular input signal. The control signal has, for at least some of the changes of attenuation levels, a predetermined sequence of changing attenuation units between the insertion state and the attenuation state, so that the transient glitches of the attenuator component is maintained within a pre-selected range when the attenuation level is transitioning between a first level and a second level. And the control unit provides the control signals to the plurality of attenuation units to achieve the selected attenuation level for the attenuation component according to the sequence when transitioning between the first level and the second level.

In one embodiment the sequence of attenuation values comprise a timing sequence by which the individual attenuation units are switched between the first and second attenuation levels at time intervals that maintain the overshoot and the undershoot of the selected attenuation level within a pre-defined range. The control unit can have a plurality of stored timing sequences for a plurality of changes from one selected attenuation level to another to control the timing of the change of individual attenuation units. The control unit can include a plurality of look up tables that have the timing sequences.

In another embodiment each of the attenuator units includes a first series switch with an associated resistance and a shunt switch wherein the first series switch is closed to provide the attenuation state and the shunt switch is closed to provide the insertion state. At least some of the attenuator units can include a second series switch and associated resistor that comprise the intermediate switching component that is configured during transitioning between the first and second attenuation level so as to maintain the transient glitches occurring during the transition of the attenuation state of the at least some of the attenuation units are reduced by the resistor associated with the second series switch.

In another aspect of this disclosure, a method of transitioning between different attenuation levels in an attenuation component having a plurality of attenuation units is provided. The method includes determining for a plurality of different attenuation level changes a timing sequence of activation of the plurality of attenuation units to transition the attenuation units between insertion and attenuation to transition from one attenuation level to another attention level that maintains transient glitch during transition between attenuation levels within a preselected range. The method also includes determining a desired change between attenuation levels; and the method includes providing control signals to the attenuation units according to the previously determined timing sequence of activation of the attenuation units to transition to the desired change between attenuation levels.

In another embodiment of the method, the sequences can comprise timing sequences of the delivery of control signals. The control signals can be provided after they are retrieved from a look up table.

In another embodiment the method can comprise transitioning one or more of the attenuator units into an intermediate state during transition between attenuation and insertion to reduce glitch transients during transition. The one or more attenuator units can include a switch resistance that is activated to reduce the transients during a time period of transition between attenuation and insertion, and the switch resistance can be deactivated once the transition is complete.

BRIEF DESCRIPTION OF THE DRAWINGS

FIG. 7A is a delay table for a switch control sequence of a multi-bit DSA system according to one embodiment of the invention.

FIG. 7B is a delay table for a switch control sequence of a multi-bit DSA system according to another embodiment of the invention.

DETAILED DESCRIPTION OF EMBODIMENTS

Figure 1:
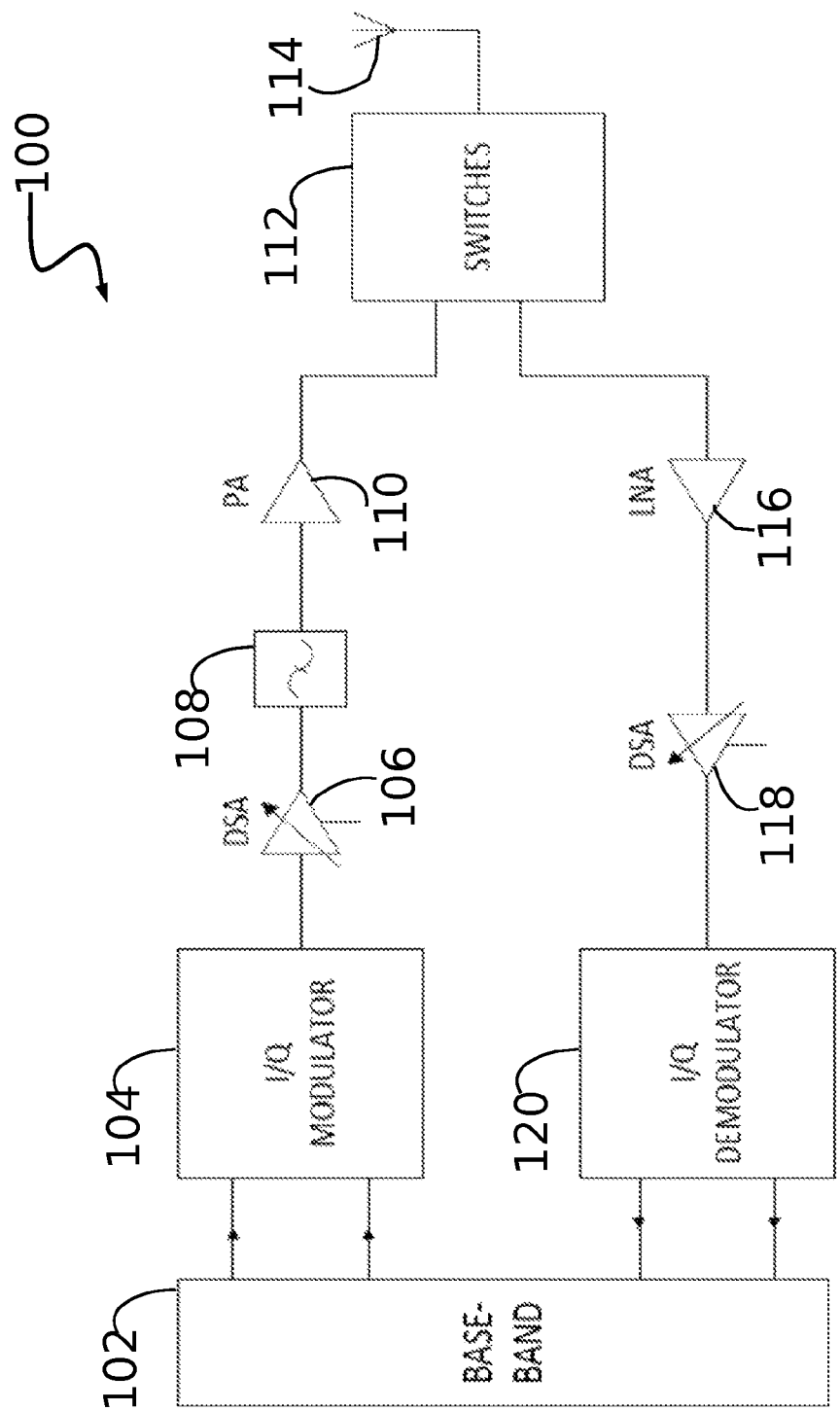
FIG. 1 is a system level diagram of an RF system including digital switched attenuators (DSAs).

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A digital step attenuator (DSA) can have a series cascaded array of attenuation units each providing a linear amount of attenuation expressed in decibels (dB) and each contributing to the total attenuation of the series array. The attenuation units can each include series and shunt switches with an attenuation network, such as hybrid-T networks, and the switches can either electrically couple the attenuation network to contribute to the total attenuation in an attenuation state or electrically bypass the attenuation network to not contribute in an insertion state. In addition, each attenuation unit can have a binary weighted bit of attenuation such as 8 dB, 4 dB, 2 dB, and 1 dB. In this manner each attenuation unit can also be referred to as an attenuation bit.

The series and shunt switches of an attenuation unit can receive control signals to control the state, insertion or attenuation, of the attenuation unit. For instance, it can be desirable to increase or decrease the amount of attenuation based upon an RF signal's power level. The DSA can attenuate an RF signal to protect RF components such as low-noise or power amplifiers. In these cases the DSA, placed before the sensitive RF components in the signal path, can protect the sensitive component by attenuating the power of the RF signal to a safe level.

However, when more than one attenuation unit changes state, there is a transition period during which the total attenuation of the DSA can change in an unpredictable manner; when the total attenuation during the transient, referred to as transient attenuation, becomes lower than the final attenuation value following the transient, then an RF signal can undergo a transient overshoot. The transient overshoot can cause an RF signal at the output of the attenuator to momentarily exceed a safe power level of an input component at the output of the attenuator and to potentially damage circuit components. Alternatively, when the transient attenuation becomes higher than the final attenuation value, then an RF signal can undergo a transient undershoot. While transient undershoot does not necessarily lead to an unsafe power level, it does cause a glitch.

In general both transient undershoot and transient overshoot cause distortion in the RF signal and are categorized as glitches. Also, an RF signal experiencing glitches due to a transient undershoot or overshoot can also experience reflections and return loss due to mismatches of attenuator impedance with the system impedance. For instance, the transient attenuation is a result of the DSA impedance undergoing a transient change in impedance, referred to as transient impedance. If the transient impedance does not match the signal path impedance, then there can be RF reflections which give rise to poor RF signal behavior and return loss.

Accordingly, limitations in the control of DSA switches can lead to transient glitches and poor RF signals; and glitches and RF signal return loss can be unacceptable for certain applications and/or systems.

Provided herein are apparatus and methods for reducing glitches in digital step attenuators (DSAs). In certain configurations, glitches, representing both undershoot and overshoot, can be reduced by sequentially controlling individual switches of a DSA. The control sequence can further be based upon a priori values of the initial and final attenuation, and additional switches can intentionally be added to certain attenuation units to enhance the control of the transient attenuation. For instance, a DSA control unit can determine, based upon the final attenuation and the initial attenuation values, a transient sequence for each switch within the DSA; and the switch sequence can be selected so that the DSA is treated as a network of switched impedances rather than a cascade of attenuation units. In this manner glitches and RF return loss are better controlled during the transient.

FIG. 1 is a system level diagram of an RF system 100 including digital switched attenuators (DSAs). Baseband I/Q signals derived from the baseband system block 102 are modulated within the I/Q modulator block 104 and follow a forward signal path through a digital step attenuator (DSA) 106, a filter 108, a power amplifier (PA) 110 into a switches block 112. The switches block 112 can pass the signal to the RF antenna 114.

In FIG. 1 the switches block 112 can also pass a received RF signal from antenna 114 along the return signal path through the low noise amplifier 116, the DSA 118, and into the I/Q demodulator 120, which provides demodulated I/Q signals to the baseband system block 102.

The digital step attenuators DSA 106 and DSA 118 can receive control signals to change the amount of attenuation in the forward and return signal paths. Both DSA 106 and DSA 118 can include attenuation units, also referred to as attenuation bits, which receive control signals to control the amount of attenuation in the signal path. For instance, the forward path DSA 106 can attenuate signals from the I/Q modulator block 104 before they reach the filter 108 so as to protect input components of both the filter 108 and power amplifier (PA) 110. Similarly, the return path DSA 118 can attenuate the output signals from the LNA 116 so as to protect sensitive components within the I/Q demodulator 120.

Figure 2:
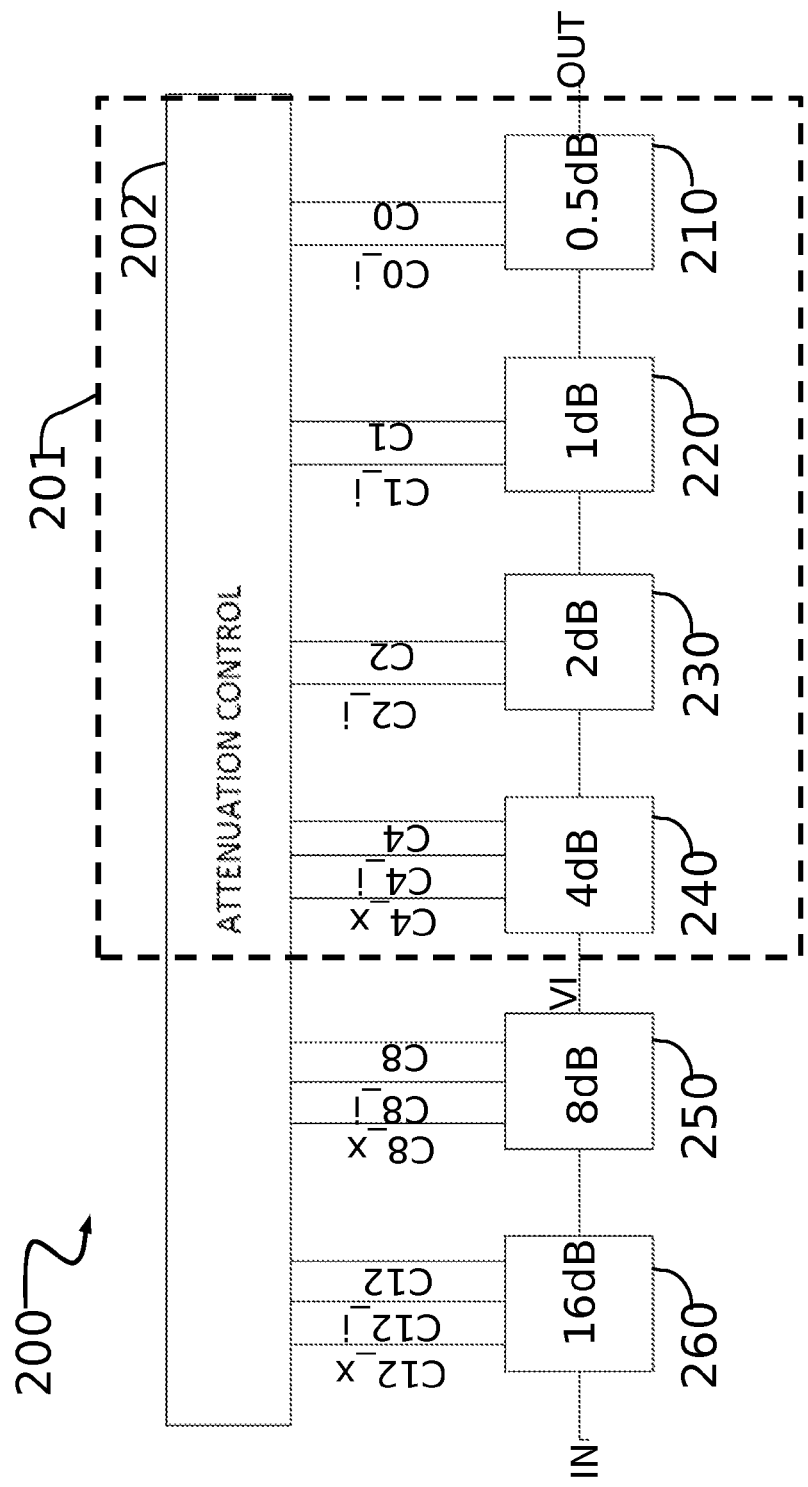
FIG. 2 is a schematic diagram of a multi-bit DSA system according to one embodiment of the invention.

FIG. 2 is a schematic diagram of a multi-bit DSA system 200 according to one embodiment of the invention. The multi-bit DSA system 200 includes six series connected attenuation units, also referred to as bits: a 0.5 dB unit 210, a 1 dB unit 220, a 2 dB unit 230, a 4 dB unit 240, an 8 dB unit 250, and a 16 dB unit 260. The six attenuation units are series connected to form a cascade between the input (IN) and output (OUT) with an input terminal of the 16 dB unit 260 operating as the input (IN) of the DSA and an output terminal of the 0.5 dB unit operating as the output (OUT). The cascade series connection between the input (IN) and output (OUT) is further detailed as follows: an output terminal of the 16 dB unit 260 is electrically connected to an input terminal of the 8 dB unit 250; an output terminal of the 8 dB unit 250 is electrically connected to an input terminal of the 4 dB unit 240; an output terminal of the 4 dB unit 240 is electrically connected to an input terminal of the 2 dB unit 230; an output terminal of the 2 dB unit 230 is electrically connected to an input terminal of the 1 dB unit 220; and an output terminal of the 1 dB unit 220 is electrically connected to an input terminal of the 0.5 dB unit 210.

The multi-bit DSA system 200 also includes an attenuation control block 202 to provide a plurality of control signals: control signals C0 and C0_i to the 0.5 dB unit 210; C1 and C1_i to the 1 dB unit 220; C2 and C2_i to the 2 dB unit 230; C4 and C4_i to the 4 dB unit 240; C8 and C8_i to the 8 dB unit 250; C12 and C12_i to the 16 dB unit 260. In this embodiment the bits having larger attenuation values, namely the 4 dB unit 240, the 8 dB unit 250, and the 16 dB unit 260, can also receive additional control signals. In addition to receiving the control signals C4 and C4_i, the 4 dB unit 240 also receives an additional C4_x control signal. Similarly, the 8 dB unit 250 receives an additional C8_x control signal; and the 16 dB unit 260 receives an additional C12_x control signal. The additional control signals, C4_x, C8_x, and C12_x can offer an additional degree of freedom in controlling the transient attenuation, which in turn, offers an additional degree of freedom in controlling glitches.

Glitches can be reduced by sequentially transitioning control signals. In determining a sequence, the multi-bit DSA 200 can be treated as a network of switches and impedances, and the goal of the sequence can be to transition switches in a way which causes the transient impedance between the input (IN) and the output (OUT) to be well controlled and confined by mathematical constraints. The DSA 200 can be divided into smaller sections such as a four bit DSA 201, as delineated in FIG. 2. It has been empirically determined that a practical approach to determine a sequence can be to treat a smaller subsection, such as the four bit DSA 201, and to perform calculations and simulations on just the smaller subsection. In this way only the impedance between the input (VI) and (OUT) of the four bit DSA 201 needs to be considered and the calculations for determining the sequence become simplified.

Figure 3:
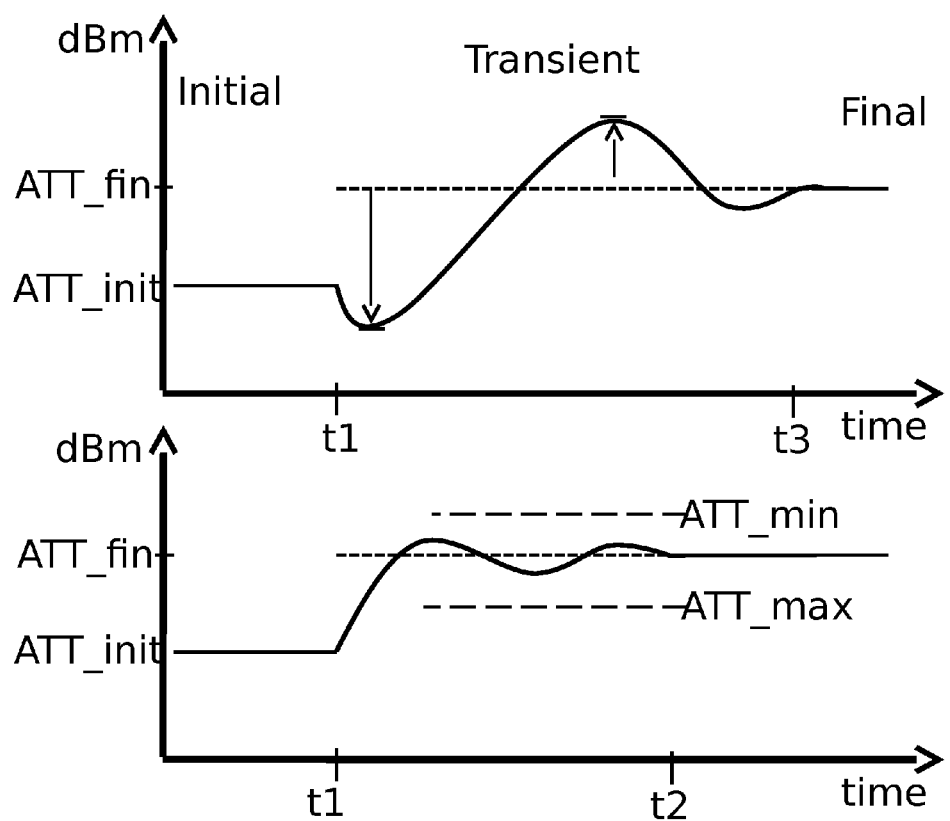
FIG. 3 shows the output waveforms of an RF signal having large glitches compared to an RF signal having reduced glitches in one embodiment of the invention.

FIG. 3 shows the output waveforms of an RF signal having large glitches compared to an RF signal having reduced glitches in one embodiment of the invention. The attenuation control block 202 initiates a change at time t1 to cause the multi-bit DSA 200 to transition from having a first steady state attenuation value of ATT_init to having a second steady state attenuation value of ATT_fin. In the top waveform of FIG. 3, the control unit 202 provides control signals in an abrupt manner causing the multi-bit DSA to have a transient attenuation value causing an initial glitch undershoot and then causing a glitch overshoot. Following the overshoot the RF signal settles to its second steady attenuation value around time t3.

The bottom waveform of FIG. 3 shows a better waveform in that the glitches are reduced during the transient, and the signal settles at a time t2 less than t3. In this waveform, the control unit better controls the transient attenuation value by preventing the initial undershoot and by keeping the transient attenuation value bounded between the attenuation boundaries of ATT_min and ATT_max.

By configuring a multi-bit DSA such that an attenuation control block sequentially changes a plurality of control signals in a manner controlling a series cascade of attenuation units to have a transient attenuation bounded between two levels, ATT_min and ATT_max, glitches can be reduced and eliminated. In these teachings a multi-bit DSA like that of the multi-bit DSA 200 of FIG. 2 can be treated as a resistive network instead of a series of attenuation units and the attenuation control block 202 can transition the resistive network so that the resistance changes sequentially. The attenuation control block 202 can further provide signals which sequentially change the network resistance according to a discrete time or delay-time based sequence. The delay-time based sequence can be based upon quasi-state criteria; for instance, the resistance can be constrained to be bounded in a way that keeps the attenuation between ATT_min and ATT_max.

Figure 4:
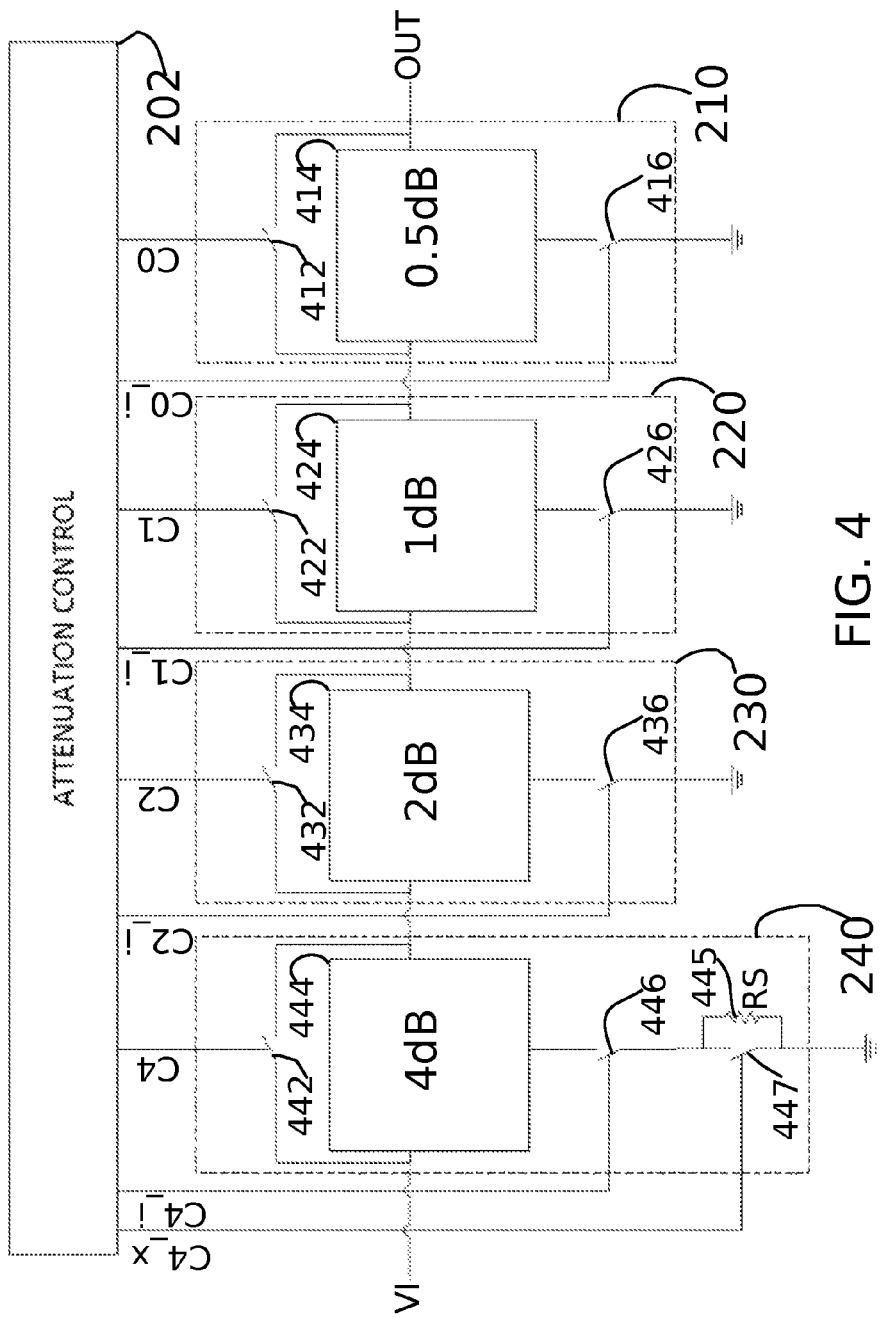
FIG. 4 is a schematic diagram of a four-bit DSA from the multi-bit DSA system according to another embodiment of the invention.

FIG. 4 is a schematic diagram of showing a four-bit DSA 201 from the multi-bit DSA system 200 according to another embodiment of the invention. In this configuration the multi-bit DSA system 200 can be configured such that an RF signal VI is received at the input of the 4 dB unit 240. FIG. 4 further details each attenuation unit 210-240. The 0.5 dB unit 210 includes a first unit terminal and a second unit terminal. The 0.5 dB unit 210 also includes an attenuation network 414 which can provide 0.5 dB of attenuation and which has a first network terminal electrically connected to the first unit terminal of the 0.5 dB unit 210, a second network terminal electrically connected to the second unit terminal of the 0.5 dB unit 210, and a third network terminal. The 0.5 dB unit 210 includes a first switch 412 having a first switch terminal electrically connected to the second unit terminal of the 0.5 dB unit 210, a second switch terminal electrically connected to the first unit terminal of the 0.5 dB unit 210, and a control terminal configured to receive the control signal C0 from the attenuation control block 202. The 0.5 dB unit 210 also includes a second switch 416 having a first switch terminal electrically connected to the third network terminal of the attenuation network 214, a second switch terminal electrically connected to ground, and a control terminal configured to receive the control signal C0_i from the attenuation control block 202.

The 0.5 dB unit 210 can receive control signals C0 and C0_i such that in the first state the second switch 416 is closed and electrically couples the third network terminal of the attenuation network 414 to ground while the first switch 412 is open and does not electrically couple the first and second unit terminals of the 0.5 dB unit 210. In this way the attenuation network 414 can provide 0.5 dB of attenuation between the first and second unit terminals of the 0.5 dB unit 210. In the second state the second switch 416 is open and does not electrically couple the third network terminal of the attenuation network 414 to ground while the first switch 412 is closed and electrically couples the first and second unit terminals of the 0.5 dB unit 210. In this way the first switch 412 can pass an RF signal such that it is not attenuated by the attenuation network 414. In this configuration the second state of the 0.5 dB unit 210 is an insertion state.

Except for labelling and the amount of attenuation, the description of the 1 dB unit 220 and the 2 dB unit 230 is similar to that of the 0.5 dB unit 210 above. The 4 dB unit 240 is also similar except it includes a third switch 447 electrically connected between a second switch 446 and ground. In particular, the third switch element 447 has a first switch terminal electrically connected to the second switch terminal of the second switch 446, a second switch terminal electrically connected to ground, and a control terminal configured to receive the control signal C4_x from the attenuation control block 202 In addition, a first bypass resistor RS 445 is electrically connected between the first and second switch terminals of the third switch 447.

In a steady state condition where the 4 dB unit operates in its first state or second state, the third switch 447 and the second switch 446 can perform the same function as a single switch. For instance, in the first state the 4 dB unit 240 can receive control the signals C4, C4_i, and C4_x such that in the first state the second switch 446 and the third switch 447 are closed and electrically couple the third network terminal of the attenuation network 444 to ground while the first switch 442 is open and does not electrically couple the first and second unit terminals of the first 4 dB unit 240. In this way the attenuation network 444 can provide 4.0 dB of attenuation between the first and second unit terminals of the first 4 dB unit 240. In the second state the second switch 446 and the third switch 447 are open and do not electrically couple the third network terminal of the attenuation network 444 to ground while the first switch 442 is closed and electrically couples the first and second unit terminals of the first 4 dB unit 240. In this way the first switch 442 can pass an RF signal such that it is not attenuated by the attenuation network 444. In this configuration the second state of the first 4 dB unit 940 is an insertion state. Thus, the addition of the third switch 447, the new control signal C4_x, and the first bypass resistor RS 445, does not affect the steady state attenuation. It can however, offer a way to control the transient attenuation.

The third switch 447 with the control signal C4_x can provide an additional degree of freedom to control the transient attenuation of the 4 dB unit 240. For instance, the control signals C4, C4_i, and C4_x can effect a change from the first state to the second state by causing the third switch 447 to open prior to causing the second switch 446 to open. In this case, the 4 dB unit 240 has a transient attenuation determined by the first bypass resistor RS 445 electrically coupled to the attenuation network 444. As seen from FIG. 4, the source of coupling between the first bypass resistor and the 4 dB attenuation network 444 is the closed second switch 446; and once the control signal C4_i causes the second switch 446 to open, the 4 dB attenuation network 444 becomes decoupled from the first bypass resistor RS 445. Also, by way of example, the control signals C4, C4_i, and C4_x can effect a change from the second state to the first state by causing the third switch 447 to close after causing the second switch 446 to open. In this way, the 4 dB unit 240 again has a transient attenuation determined by the first bypass resistor coupled to the attenuation network 444. Once the third switch 447 closes, the bypass resistor RS 445 is electrically shorted by the third switch 447.

Figure 5:
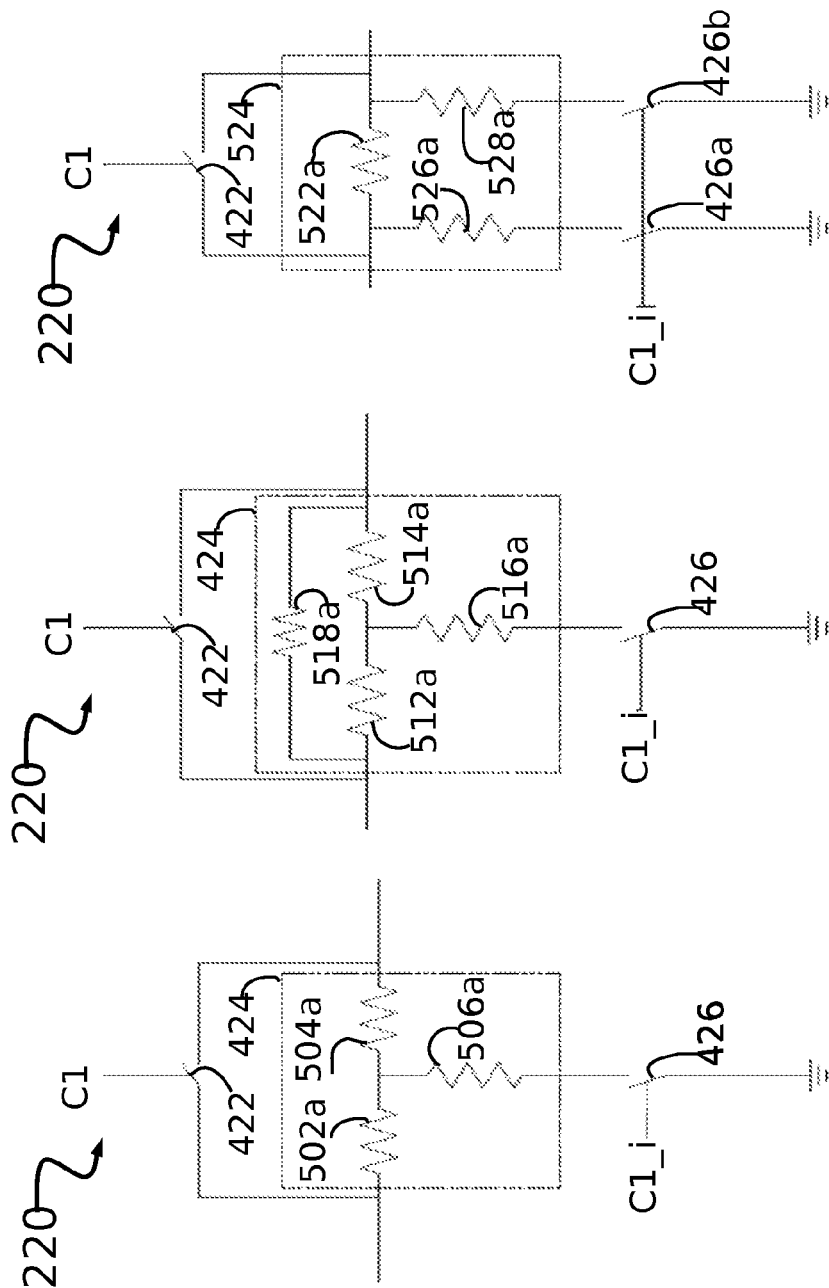
FIG. 5A is a schematic diagram of an attenuation unit for realizing a DSA bit according to one embodiment of the invention.
FIG. 5B is a schematic diagram of an attenuation unit for realizing a DSA bit according to another embodiment of the invention.
FIG. 5C is a schematic diagram of an attenuation unit for realizing a DSA bit according to another embodiment of the invention.

FIG. 5A is a schematic diagram of the 1 dB unit 220 for realizing a DSA bit according to one embodiment of the invention. As shown an attenuation network 424 includes a first resistor 502a electrically connected between the first network terminal of the attenuation network 424 and a center terminal, a second resistor 504a electrically connected between the second network terminal of the attenuation network 424 and the center terminal, and a third resistor 506a electrically connected between the center tap and the third network terminal of the attenuation network 424. The first-third resistors 502a-506a form a T-type network and can attenuate an RF signal between the first and the second network terminals of the attenuation network 424. In particular to the 1 dB unit 220, the resistors can attenuate an RF signal in the amount of 1 dB and can be balanced to known impedance. While this schematic provides general circuit detail without specifying resistor values to one embodiment of the attenuation network 424, this schematic can also apply to the construction of the attenuation networks of each of the attenuation units 210-260. Furthermore, the construction of attenuation networks should be common knowledge to those skilled in the art of RF systems having digital step attenuators.

FIG. 5B is a schematic diagram of the 1 dB unit 220 for realizing a DSA bit according to another embodiment of the invention. Here the attenuation network 424 includes a first resistor 512a electrically connected between the first network terminal of the attenuation network 424 and a center terminal, a second resistor 514a electrically connected between the second network terminal of the attenuation network 424 and the center terminal, a third resistor 516a electrically connected between the center tap and the third network terminal of the attenuation network 424, and a fourth resistor 518a electrically connected between the first and second network terminals of the attenuation network 424. The first-fourth resistors 512a-518a form a hybrid-T network and can attenuate an RF signal between the first and the second network terminals of the attenuation network 424. In particular to the 1 dB unit 220, the resistors can attenuate an RF signal in the amount of 1 dB and can be balanced to known impedance. While this schematic provides general circuit detail without specifying resistor values to one embodiment of the attenuation network 424, this schematic can also apply to the construction of the attenuation networks of each of the attenuation units 210-260. Furthermore, the construction of attenuation networks should be common knowledge to those skilled in the art of RF systems having digital step attenuators.

FIG. 4C is a schematic diagram of the 1 dB unit 220 for realizing a DSA bit according to another embodiment of the invention having an attenuation network 524. Similar to the attenuation network 424, the attenuation network 524 includes a first network terminal electrically connected to the first unit terminal of the 1 dB unit 220, a second network terminal electrically connected to the second unit terminal of the 1 dB unit 220, and a third network terminal electrically connected to the first switch terminal of a second switch 426a. In contrast to the attenuation network 424, the attenuation network 524 further includes a fourth network terminal which is electrically connected to a first switch terminal of a third switch 426b of the 1 dB unit 220. The second switch terminal of the third switch 426b is electrically connected to ground. The attenuation network 524 further includes a first resistor 522a electrically connected between the first and second network terminals of the attenuation network 524, a second resistor 526a electrically connected between the first and third network terminals of the attenuation network 524, and a third resistor 528a electrically connected between the second and fourth network terminals of the attenuation network 524. The first-third resistors 522a-528a form a pi-type network and can attenuate an RF signal between the first and the second network terminals of the attenuation network 524. In particular to the 1 dB unit 220, the resistors can attenuate an RF signal in the amount of 1 dB and can be balanced to known impedance. Also, the third switch 426b further includes a control terminal configured to receive the control signal C1_i.

As illustrated in the configuration of FIG. 5C, the third switch 426b of the 1 dB unit 220 can operate in parallel with the second switch 426a of the 1 dB unit 220. Furthermore, the operation of the 1 dB unit 220 of FIG. 5C in the first and second state can be equivalent to the operation of the 1 dB unit 220 of previous figures and reference can be made to the discussions for the previous figures. Also, while this schematic provides general circuit detail without specifying resistor values to one embodiment of the attenuation network 524, this schematic can also apply to the construction of the attenuation networks of each of the attenuation units 210-260. Furthermore, the construction of attenuation networks should be common knowledge to those skilled in the art of RF systems having digital step attenuators.

Figure 6:
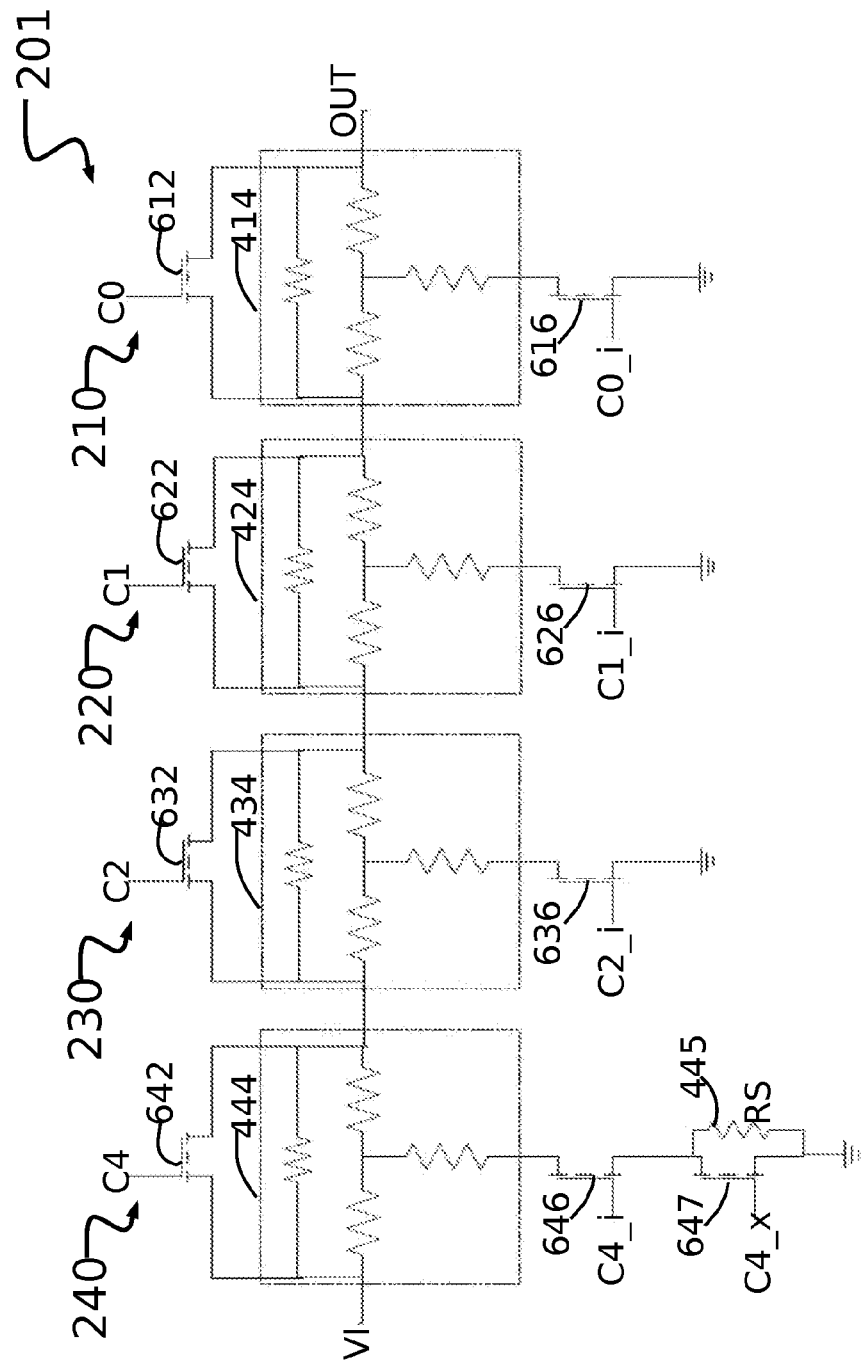
FIG. 6 is a schematic diagram of a four-bit DSA system using FETs according to another embodiment of the invention.

FIG. 6 is a schematic diagram of the four-bit DSA system 201 using FETs as switches according to another embodiment of the invention. In the illustrated configuration the 0.5 dB unit 210 includes the following: a first FET 612 having a drain connected to the second unit terminal of the 0.5 dB unit 210, a source connected to the first unit terminal of the 0.5 dB unit 210, and a gate configured to receive the control signal C0; and a second FET 616 having a drain connected to the third unit terminal of the 0.5 dB unit 210, a source connected to ground, and a gate configured to receive the control signal C0_i. The 1 dB unit 220 includes the following: a first FET 622 having a drain connected to the second unit terminal of the 1 dB unit 220, a source connected to the first unit terminal of the 1 dB unit 220, and a gate configured to receive the control signal C1; and a second FET 626 having a drain connected to the third unit terminal of the 1 dB unit 220, a source connected to ground, and a gate configured to receive the control signal C1_i. The 2 dB unit 230 includes the following: a first FET 632 having a drain connected to the second unit terminal of the 2 dB unit 230, a source connected to the first unit terminal of the 2 dB unit 230, and a gate configured to receive the control signal C2; and a second FET 636 having a drain connected to the third unit terminal of the 2 dB unit 230, a source connected to ground, and a gate configured to receive the control signal C2_i. The 4 dB unit 240 includes the following: a first FET 642 having a drain connected to the second unit terminal of the 4 dB unit 240, a source connected to the first unit terminal of the 4 dB unit 240, and a gate configured to receive the control signal C4; a second FET 646 having a drain connected to the third unit terminal of the 4 dB unit 240, a source, and a gate configured to receive the control signal C4_i; and a third FET 647 having a drain connected to the source of the second FET 646, a source connected to ground, and a gate configured to receive the control signal C4_x. In addition, a first bypass resistor RS 445 is electrically connected between the source and drain of the third FET 647.

The operation of the first FET 612 and the second FET 616 is analogous to the operation of the first switch 412 and the second switch 416 of the four-bit DSA system 201 of FIG. 4. When the first FET 612 and the second FET 616 are N-channel devices, then each can operate as a closed switch when the control signals C0_i and C0 force a high voltage. Conversely, each can operate as an open switch when the control signals C0_i and C0 force a low voltage. For instance, the signals C0 and C0_i can be voltages such that in the first state the second FET 616 operates with low drain-to-source impedance so as to electrically couple the third network terminal of the attenuation network 414 to ground while the first FET 612 operates with high drain-to-source impedance so as to not electrically couple the first and second unit terminals of the 0.5 dB unit 210. In this way the attenuation network 414 can provide 0.5 dB of attenuation between the first and second unit terminals of the 0.5 dB unit 414. In the second state the second FET 616 operates with high drain-to-source impedance so as to not electrically couple the third network terminal of the attenuation network 414 to ground while the first FET 612 operates with low drain-to-source impedance so as to electrically couple the first and second unit terminals of the 0.5 dB unit 210. In this way the first FET 612 can pass an RF signal such that it is not attenuated by the attenuation network 414. In this configuration the second state of the 0.5 dB unit 210 is an insertion state.

Controlling FET's with voltages is well known to those practiced in the art of electrical engineering and DSA design, and embodiments should be clear to those who design switches and control units.

In FIG. 6 the discussion relating to the operation of the first FET 612 and the second FET 616 as switches also applies to each FET of the four-bit DSA 201, and the description of how the switches function can be found in the discussion relating to the four-bit DSA 201 of FIG. 4.

Also, in FIG. 6 each of the FETs 612-647 can be either N-channel or P-channel and the control signals C0, C0_i, C1, C1_i, C2, C2_i, C4, C4_i, C4_x can be voltage signals appropriate to the type of FET, either N-channel or P-channel.

FIG. 7A is a delay table for a switch control sequence of a multi-bit DSA system according to one embodiment of the invention. In this example a multi-bit DSA similar to that of multi-bit DSA 200 transitions the control signals based upon a unit delay time Λ equal to 17 nsec. The left column shows the control signal and the right column shows the calculated or estimated delay time given by multiples of the unit delay time. The control unit 202 can use and derive values such as those given in FIG. 7A, or it can use a system which calculates the delay times based upon real-time measurements and calculations. Other techniques for deriving the control signal delay time can include using a digital signal processor within a feedback system. FIG. 7A can apply to a case where the multi-bit DSA 200 changes from 4 dB to 3.5 dB and must settle within 400 ns. Having this sequence, an RF signal can be controlled during the above transient to have a maximum ripple of 0.7 dB. It can also be controlled so that an output RF signal initially increases without an initial undershoot. The last control signal to control a switch to change state is C2 which transitions at the max delay time of 14 times the unit delay time (238 ns).

FIG. 7B is another delay table for a switch control sequence of a multi-bit DSA system according to one embodiment of the invention. This case can also apply to the multi-bit DSA 200; however, now the control unit 202 is configured to effect a change from 3.5 dB to 4.0 dB, and the table of FIG. 7B differs from that of FIG. 7A. Because the second attenuation value in the steady state is greater than the first attenuation value, the control sequence is calculated to satisfy different criteria. For instance the control signals are sequenced to prevent an initial undershoot of the RF output signal rather than an initial overshoot. Comparison of the columns of FIGS. 7A and 7B shows the control sequence can depend greatly on the first attenuation value and the second attenuation value. In general the control sequence for increasing to a larger second attenuation value can be different from a control sequence for decreasing to a smaller second attenuation value.

Figure 8:
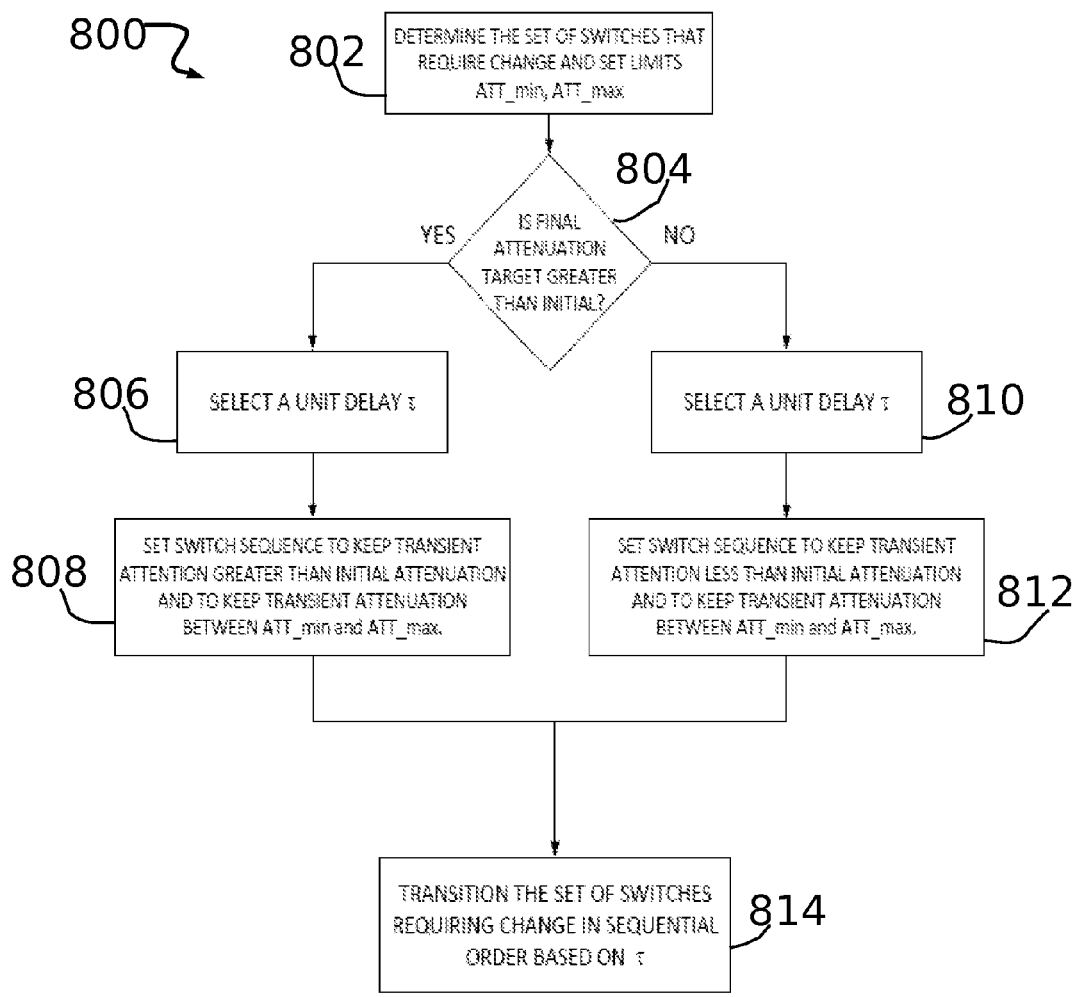
FIG. 8 is a flow diagram of a multi-bit DSA system control method according to one embodiment of the invention.

FIG. 8 is a flow diagram of a multi-bit DSA system control method 800 according to one embodiment of the invention. Control method 800 provides an embodiment of a method for sequencing the switches of a multi-bit DSA, such as the multi-bit DSA 200, when changing from a first attenuation value to a second attenuation value. A first operation 802 determines which switches from the whole network of switches will change state. This step can also set the values of ATT_min, ATT_max bounding the transient attenuation and also bounding the RF signal. The decision block 804 can decide the relationship between the initial attenuation value, which is the first attenuation value, and the final attenuation value, which is the second attenuation value. If the final attenuation value is greater than the initial attenuation value, then the flow proceeds to an operation step 806.

The operation step 806 selects a unit time delay appropriate to targeting a final attenuation value which is greater than an initial attenuation value. Following operation step 806, an operation step 808 can find a switch sequence which meets the criteria including bounding the attenuation between a minimum ATT_min and maximum ATT_max and transitioning the switches so that the transient attenuation value is always greater than the initial attenuation value. If the final attenuation value is less than the initial attenuation, then the flow proceeds to an operation step 810. The operation step 810 selects a unit time delay appropriate to targeting a final attenuation value which is less than an initial attenuation value. During the operation step 812, the switch sequence is arranged to meet similar criteria as in operation step 808; however, the differentiating criterion includes transitioning the switches so that the transient attenuation value is always less than the initial attenuation value. In the final operation step 814 the switches are sequenced based upon the switch sequence determined in the previous steps. The type of sequence can be similar to those presented in FIGS. 7A and 7B.

As shown in the system control method 800 of FIG. 8, the switch sequence is derived before the switches transition states from either an off state or on state. For instance, the operation step 808, which sets the switch sequence, occurs, before the control signals transition the states of the switches. FIGS. 7A and 7B are examples of switch sequences where the control signal makes a transition at a multiple of a unit delay time. In one embodiment the switches can be FETs and the control signals can be gate signals which change the voltages on FETs. The selected control sequence is derived based upon the criteria of the attenuation network. More importantly, it can be derived using methods well known to electrical engineers and those practiced in the art of control and DSAs. For instance, the switch sequence can be derived using software or simulation approaches. In other embodiments, the switch sequence can be derived from feedback information, and a parameter, such as the unit delay time, can be a control parameter adjusted in response to feedback. In another embodiment the sequence can be taken from a look up table such as that shown in FIGS. 7A and 7B.

APPLICATIONS

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A digital step attenuator (DSA) configured to attenuate an input signal between the first DSA port and the second DSA port, the DSA comprising:
    a plurality of binary weighted attenuator units connected in series, including a first attenuator unit and a second attenuator unit, each of the first and second attenuator units comprising a plurality of DSA switches, wherein the plurality of DSA switches comprises at least one shunt switch connected in parallel with a shunt resistor; and
    a control unit that provides control signals to the plurality of DSA switches so as to provide a selected DSA attenuation level for a particular input signal according to a sequence when the DSA attenuation level is transitioning between a first attenuation level and a second attenuation level, the sequence including changing the switch state of a first switch of the first attenuator unit, subsequently changing the switch state of a first switch of the second attenuator unit, and subsequently changing the switch state of a second switch of the first attenuator unit.

2. The DSA of claim 1, wherein the control unit provides control signals to the plurality of DSA switches to achieve the selected DSA attenuation level according to the sequence so that a transient glitch of the DSA is maintained within a preselected range when transitioning between the first attenuation level and the second attenuation level.

3. The DSA of claim 2, wherein the sequence comprises a timing sequence by which the plurality of DSA switches are switched between an open switch state and a closed switch state.

4. The DSA of claim 3, wherein the control unit has a plurality of stored timing sequences for a plurality of changes from one selected attenuation level to another to control the timing of the sequence.

5. The DSA of claim 4, wherein the control unit includes a plurality of look up tables that have the plurality of stored timing sequences.

6. The DSA of claim 1, wherein the first and second attenuator units have a unit input and a unit output, wherein the first switch is electrically connected between the unit input and the unit output, wherein the second switch and the at least one shunt switch are electrically connected in a first circuit path to a ground node, wherein each of the first and second attenuator units is configured to attenuate the input signal in an attenuation state when the second switch and the at least one shunt switch are closed and to transmit the input signal in an insertion state when the first switch is closed.

7. The DSA of claim 6, wherein at least some of the binary weighted attenuator units include a third switch and a fourth switch electrically connected in a second circuit path to the ground node, wherein the fourth switch is connected in parallel with a second shunt resistor, and wherein the plurality of DSA switches further comprises the third switch and the fourth switch from each of the at least some of the binary weighted attenuator units.

8. A digital step attenuator (DSA) configured to attenuate an input signal between the first DSA port and the second DSA port, the DSA comprising:
    a plurality of binary weighted attenuator units connected in series, including a first attenuator unit and a second attenuator unit, each of the first and second attenuator units comprising a plurality of DSA switches; and
    a control unit that provides control signals to the plurality of DSA switches so as to provide a selected DSA attenuation level for a particular input signal, wherein the control signals achieve the selected DSA attenuation level according to a sequence of changing switch states of the plurality of DSA switches when transitioning between a first attenuation level and a second attenuation level, the sequence including changing the switch state of a first switch of the first attenuator unit, subsequently changing the switch state of a first switch of the second attenuator unit, and subsequently changing the switch state of a second switch of the first attenuator unit.

9. The DSA of claim 8, wherein the sequence of changing switch states of the plurality of DSA switches comprises a timing sequence by which the plurality of DSA switches are switched between an open switch state and a closed switch state at time intervals that maintain an overshoot and an undershoot of a transient glitch of the selected DSA attenuation level within a pre-defined range.

10. The DSA of claim 9, wherein the control unit has a plurality of stored timing sequences for a plurality of changes from one selected DSA attenuation level to another to control the timing of the sequence.

11. The DSA of claim 10, wherein the control unit includes a plurality of look up tables that have the plurality of stored timing sequences.

12. The DSA of claim 8, wherein the first and second attenuator units each has a unit input and a unit output, wherein the first switch is electrically connected between the unit input and the unit output, wherein the second switch is electrically connected in a first circuit path to a first supply node, wherein each of the first and second attenuator units is configured to attenuate the input signal in an attenuation state when the second switch is closed and to transmit the input signal in an insertion state when the first switch is closed.

13. The DSA of claim 12, wherein at least some of the plurality of binary weighted attenuator units include a third switch, electrically connected in a second circuit path to the first supply node, and wherein the plurality of DSA switches further comprises the third switch from each of the at least some of the plurality of binary weighted attenuator units.

14. The DSA of claim 8, wherein the plurality of binary weighted DSA attenuator units each comprise an attenuation network selected from the group consisting of T-type networks, hybrid-T networks, and pi-type networks.

15. The DSA of claim 8, wherein the plurality of DSA switches are configured to receive control signals from the control unit such that the first and a second attenuator units transition between an attenuation state and an insertion state, wherein the sequence includes a unit time value T and a table of delays for each of the plurality of DSA switches which transition between the attenuation state and the insertion state, and wherein the table of delays determines the timing of the delivery of the control signals as a function of the unit time value T.

16. A method of transitioning between different attenuation levels in a DSA having a plurality of binary weighted attenuator units, the method comprising:
selecting two or more switches from a plurality of DSA switches, the plurality of DSA switches comprising a shunt switch and a series switch from each of the plurality of binary weighted attenuator units;
determining a timing sequence of changing a switch state of the two or more switches so as to maintain a transient glitch during transition between a first attenuation level and a second attenuation level to be within a preselected range; and
providing control signals to the two or more switches from the plurality of DSA switches according to the timing sequence, the timing sequence including changing the switch state of a first switch of a first attenuator unit, subsequently changing the switch state of a first switch of a second attenuator unit, and subsequently changing the switch state of a second switch of a first attenuator unit.

17. The method of claim 16, further comprising changing the switch state of a second shunt switch so as to place the DSA into an intermediate state during transition between the first attenuation level and the second attenuation level, wherein at least one of the binary weighted attenuator units comprises the second shunt switch, and wherein the plurality of DSA switches comprises the second shunt switch.

18. The method of claim 17, wherein the second shunt switch is connected in parallel with a switch resistor.

19. The method of claim 16, wherein determining the timing sequence comprises simulating the timing sequence based on a unit delay time.

20. The method of claim 16, wherein determining the timing sequence comprises retrieving the timing sequence from a look up table.

* * * * *